United States Patent
Zhu et al.

(10) Patent No.: US 7,961,509 B2
(45) Date of Patent: Jun. 14, 2011

(54) SPIN-TRANSFER TORQUE MEMORY SELF-REFERENCE READ AND WRITE ASSIST METHODS

(75) Inventors: Wenzhong Zhu, Apple Valley, MN (US); Yiran Chen, Eden Prairie, MN (US); Xiaobin Wang, Chanhassen, MN (US); Zheng Gao, Savage, MN (US); Haiwen Xi, Prior Lake, MN (US); Dimitar V. Dimitrov, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 12/903,305

(22) Filed: Oct. 13, 2010

(65) Prior Publication Data

US 2011/0026317 A1 Feb. 3, 2011

Related U.S. Application Data

(63) Continuation of application No. 12/372,180, filed on Feb. 17, 2009, now Pat. No. 7,826,260.

(60) Provisional application No. 61/108,795, filed on Oct. 27, 2008.

(51) Int. Cl.
*G11C 11/14* (2006.01)

(52) U.S. Cl. .......... 365/171; 365/100; 365/97; 365/148; 365/189.07

(58) Field of Classification Search .................. 365/171, 365/100, 97, 148, 189.07
See application file for complete search history.

(56) References Cited

U.S. PATENT DOCUMENTS

| | | | |
|---|---|---|---|
| 6,317,356 B1 | 11/2001 | Hoffmann | |
| 6,870,760 B2 | 3/2005 | Tsang | |
| 7,102,946 B2 | 9/2006 | Pelella | |
| 7,123,505 B2 | 10/2006 | Jeong | |
| 7,170,782 B2 | 1/2007 | Conley | |
| 7,187,577 B1 | 3/2007 | Wang | |
| 7,224,601 B2 | 5/2007 | Panchula | |
| 7,272,034 B1 | 9/2007 | Chen | |
| 7,272,035 B1 | 9/2007 | Chen | |
| 7,289,356 B2 | 10/2007 | Diao | |
| 7,345,912 B2 | 3/2008 | Luo | |
| 7,379,327 B2 | 5/2008 | Chen | |
| 7,502,249 B1 | 3/2009 | Ding | |
| 7,515,457 B2 | 4/2009 | Chen | |
| 2005/0213375 A1 | 9/2005 | Perner | |

(Continued)

OTHER PUBLICATIONS

U.S. Appl. No. 12/147,727, filed Jun. 27, 2008, Chen.

(Continued)

*Primary Examiner* — Thong Q Le
(74) *Attorney, Agent, or Firm* — Campbell Nelson Whipps LLC

(57) ABSTRACT

A spin-transfer torque memory apparatus and self-reference read and write assist schemes are described. One method of self-reference reading a spin-transfer torque memory unit includes applying a first read current through a magnetic tunnel junction data cell and forming a first bit line read voltage. A magnetic field is applied through the free magnetic layer the forming a magnetic field modified magnetic tunnel junction data cell. Then a second read current is applied thorough the magnetic field modified magnetic tunnel junction data cell forming a second bit line read voltage and compared with the first bit line read voltage to determine whether the first resistance state of the magnetic tunnel junction data cell was a high resistance state or low resistance state. Methods of applying a destabilizing magnetic field to the MTJ and then writing the desired resistance state are also disclosed.

20 Claims, 9 Drawing Sheets

U.S. PATENT DOCUMENTS

| | | |
|---|---|---|
| 2006/0013039 A1 | 1/2006 | Braun |
| 2006/0098498 A1 | 5/2006 | Jeong |
| 2006/0233018 A1 | 10/2006 | Tanizaki |
| 2007/0246787 A1 | 10/2007 | Wang |
| 2008/0310213 A1 | 12/2008 | Chen |
| 2008/0310219 A1 | 12/2008 | Chen |
| 2009/0040855 A1 | 2/2009 | Luo |
| 2009/0185410 A1 | 7/2009 | Huai |
| 2009/0323402 A1* | 12/2009 | Li et al. .......................... 365/158 |

OTHER PUBLICATIONS

U.S. Appl. No. 12/372,180, filed Feb. 17, 2009, Zhu.

* cited by examiner

SPIN-TRANSFER TORQUE MEMORY SELF-REFERENCE READ AND WRITE ASSIST METHODS

CROSS-REFERENCE TO RELATED APPLICATIONS

This application is a continuation application of U.S. application Ser. No. 12/372,180 filed on Feb. 17, 2009 which claims the benefit of U.S. Provisional Application No. 61/108,795 filed Oct. 27, 2008, the contents of both are hereby incorporated by reference in their entirety.

BACKGROUND

Fast growth of the pervasive computing and handheld/communication industry has generated exploding demand for high capacity nonvolatile solid-state data storage devices. It is believed that nonvolatile memories, especially flash memory, will replace DRAM to occupy the biggest share of memory market. However, flash memory has several drawbacks such as slow access speed (~ms write and ~50-100 ns read), limited endurance (~$10^3$-$10^4$ programming cycles), and the integration difficulty in system-on-chip (SoC). Flash memory (NAND or NOR) also faces significant scaling problems at 32 nm node and beyond.

Magneto-resistive Random Access Memory (MRAM) is a promising candidate for future nonvolatile and universal memory. MRAM features non-volatility, fast writing/reading speed (<10 ns), almost unlimited programming endurance (>$10^{15}$ cycles) and zero standby power. The basic component of MRAM is a magnetic tunneling junction (MTJ). Data storage is realized by switching the resistance of MTJ between a high-resistance state and a low-resistance state. MRAM switches the MTJ resistance by using a current induced magnetic field to switch the magnetization of MTJ. As the MTJ size shrinks, the switching magnetic field amplitude increases and the switching variation becomes more severe. Hence, the incurred high power consumption limits the scaling of conventional MRAM.

Recently, a new write mechanism, which is based upon spin polarization current induced magnetization switching, was introduced to the MRAM design. This new MRAM design, called Spin-Torque Transfer RAM (STRAM), uses a (bidirectional) current through the magnetic tunnel junction (i.e., "MTJ") to realize the resistance switching. Therefore, the switching mechanism of STRAM is constrained locally and STRAM is believed to have a better scaling property than the conventional MRAM.

However, many yield-limiting factors must be overcome before STRAM enters the production stage. One challenge is the large MTJ resistance variation, which is exponentially dependent on the thickness of oxide barrier in it. For example, increasing the thickness of oxide barrier from 14 Angstroms to 14.1 Angstroms changes the MTJ resistance by 8%. This large MTJ resistance variation can create problems during a read operation of the MTJ.

BRIEF SUMMARY

The present disclosure relates to spin-transfer torque random access memory self-reference read and write assist operations. In particular, present disclosure relates to a spin-transfer torque random access memory self-reference read operation that utilizes an external magnetic field to rotate the free layer magnetization orientation without switching the data resistance state of the MTJ and provide a large dynamic reading current range, and a write operation that utilizes the external magnetic field to reduce a write current.

One illustrative method of reading a spin-transfer torque memory unit includes applying a first read current through a magnetic tunnel junction data cell and forming a first bit line read voltage, the magnetic tunnel junction data cell having a first resistance state, the magnetic tunnel junction includes a free magnetic layer having a magnetization orientation. The first bit line read voltage is stored in a first voltage storage device. A magnetic field is applied through the free magnetic layer forming a magnetic field modified magnetic tunnel junction data cell. The magnetic field rotates the magnetization orientation of the free magnetic layer without switching a resistance state of the magnetic tunnel junction data cell. Then a second read current is applied thorough the magnetic field modified magnetic tunnel junction data cell having the first resistance state, forming a second bit line read voltage. The first read current is less than the second read current and the second bit line read voltage is stored in a second voltage storage device. Then the stored first bit line read voltage is compared with the stored second bit line read voltage to determine whether the first resistance state of the magnetic tunnel junction data cell was a high resistance state or low resistance state.

An illustrative method of magnetic field assisted writing of a spin-transfer torque memory unit includes applying a magnetic field through a free magnetic layer of a magnetic tunnel junction data cell, forming a magnetic field modified magnetic tunnel junction data cell. The magnetic field rotates the magnetization orientation of the free magnetic layer. Then the method includes applying a write current through the magnetic field modified magnetic tunnel junction data cell to switch the magnetic field modified magnetic tunnel junction data cell between a high resistance state and low resistance state.

BRIEF DESCRIPTION OF THE DRAWINGS

The disclosure may be more completely understood in consideration of the following detailed description of various embodiments of the disclosure in connection with the accompanying drawings, in which.

DETAILED DESCRIPTION

Figure 1:
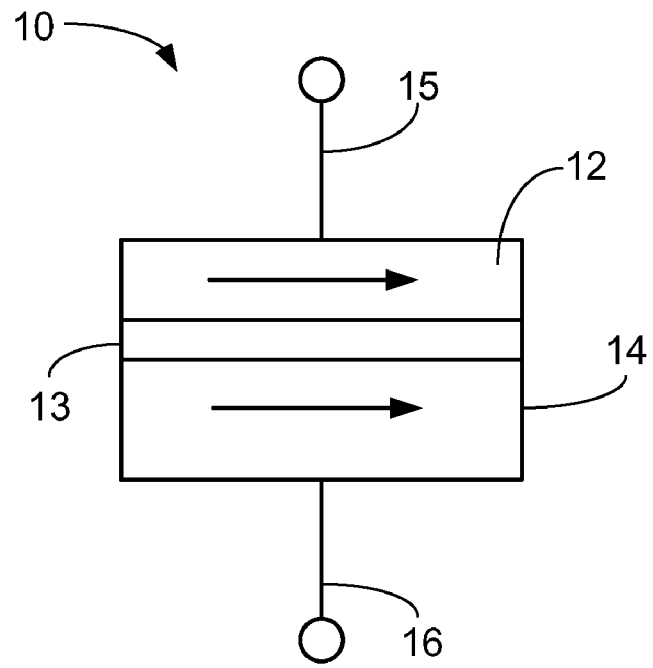
FIG. 1 is a cross-sectional schematic diagram of an illustrative spin-transfer torque MTJ memory unit in the low resistance state.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to spin-transfer torque memory apparatus and self-reference read and write assist schemes. In particular, the present disclosure relates to self-reference reading methods that determine whether a spin-transfer torque memory unit has a high resistance state or low resistance state data state, without disturbing the original data resistance state of the spin-transfer torque memory unit. The apparatus and methods described herein ensure that the value of the spin-transfer torque memory unit can be determined regardless of the resistance variation of the spin-transfer torque memory units within a memory array. The read voltage of the spin-transfer torque memory unit at a first read current and a second read current are stored sequentially and compared to detect the resistance state or data state of the spin-transfer torque memory unit. The second read voltage is read and stored after a magnetic field is applied through the free layer of the magnetic tunnel junction. The magnetic field rotates the free layer magnetization orientation without switching the data resistance state of the MTJ and provides a large dynamic reading current range. During writing, the magnetic field destabilizes the initial resistive data state of the magnetic tunnel junction, such that the switching current is reduced. Preserving the original resistance state eliminates the "standard-value-write" and "write-back" steps that are required in "destructive self-reference" read methods. During reading, the horizontal component of the external field generates magnetic torque whose direction is opposite to the spin torque, so that a large reading current can be used without flipping the free layer magnetization orientation. At the same time, the perpendicular component generates a magnetic torque to rotate the free layer magnetization orientation, and the reading margin is further increased. During writing, the horizontal component of the external magnetic field generates a magnetic torque whose direction is the same as that of spin torque, and the perpendicular component generates magnetic torque to increase initial angle, such that the switching current is reduced and the write speed is increased. Thus the disclosed read methods improve the read operation reading margin and improve the reliability of the non-volatile data, while the disclosed write method increases the writing speed and lowers the write current. While the present disclosure is not so limited, an appreciation of various aspects of the disclosure will be gained through a discussion of the examples provided below.

Figure 2:
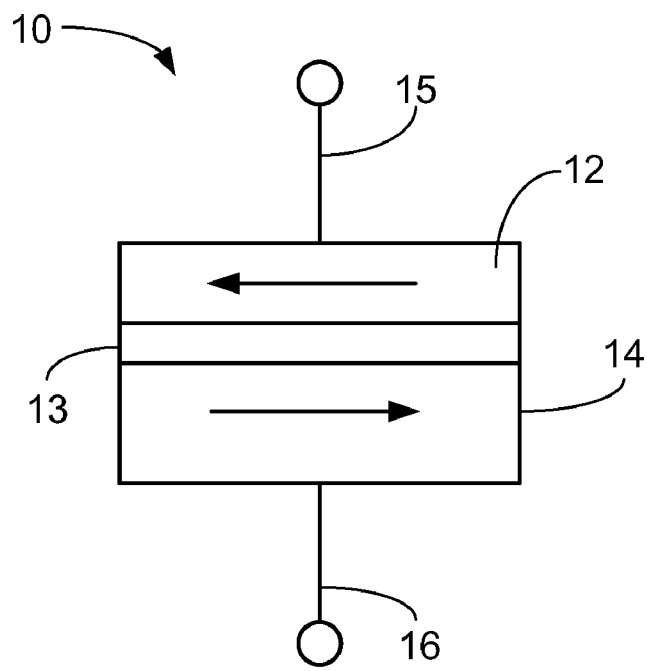
FIG. 2 is a cross-sectional schematic diagram of another spin-transfer torque MTJ memory unit in the high resistance state.

FIG. 1 is a cross-sectional schematic diagram of an illustrative spin-transfer torque MTJ memory unit 10 in the low resistance state and FIG. 2 is a cross-sectional schematic diagram of another spin-transfer torque MTJ memory unit 10 in the high resistance state. A magnetic tunnel junction (MTJ) memory unit 10 includes a magnetic (e.g., ferromagnetic) free layer 12 and a magnetic (e.g., ferromagnetic) reference (i.e., pinned) layer 14. The magnetic free layer 12 and a magnetic reference layer 14 are separated by an oxide barrier layer 13 or tunnel barrier. A first electrode 15 is in electrical contact with the magnetic free layer 12 and a second electrode 16 is in electrical contact with the magnetic reference layer 14. The magnetic layers 12, 14 may be made of any useful ferromagnetic (FM) alloys such as, for example, Fe, Co, Ni and the insulating barrier layer 13 may be made of an electrically insulating material such as, for example an oxide material (e.g., $Al_2O_3$ or MgO). Other suitable materials may also be used.

The electrodes 15, 16 electrically connect the magnetic layers 12, 14 to a control circuit providing read and write currents through the magnetic layers 12, 14. The resistance across the spin-transfer torque MTJ memory unit 10 is determined by the relative orientation of the magnetization vectors or magnetization orientations of the magnetic layers 12, 14. The magnetization direction of the magnetic reference layer 14 is pinned in a predetermined direction while the magnetization direction of the magnetic free layer 12 is free to rotate under the influence of a spin torque. Pinning of the magnetic reference layer 14 may be achieved through, e.g., the use of exchange bias with an antiferromagnetically ordered material such as PtMn, IrMn and others.

FIG. 1 illustrates the spin-transfer torque MTJ memory unit 10 in the low resistance state where the magnetization orientation of the magnetic free layer 12 is parallel and in the same direction of the magnetization orientation of the magnetic reference layer 14. This is termed the low resistance state or "0" data state. FIG. 2 illustrates the spin-transfer torque MTJ memory unit 10 in the high resistance state where the magnetization orientation of the magnetic free layer 12 is anti-parallel and in the opposite direction of the magnetization orientation of the magnetic reference layer 14. This is termed the high resistance state or "1" data state.

Switching the resistance state and hence the data state of the MTJ memory unit 10 via spin-transfer occurs when a current, passing through a magnetic layer of the MTJ memory unit 10, becomes spin polarized (i.e., polarized) and imparts a spin torque on the free layer 12 of the MTJ 10. When a sufficient spin torque is applied to the free layer 12, the magnetization orientation of the free layer 12 can be switched between two opposite directions and accordingly the MTJ 10 can be switched between the parallel state (i.e., low resistance state or "0" data state) and anti-parallel state (i.e., high resistance state or "1" data state) depending on the direction of the current.

The illustrative spin-transfer torque MTJ memory unit 10 may be used to construct a memory device that includes multiple MTJ memory units where a data bit is stored in spin-transfer torque MTJ memory unit by changing the relative magnetization state of the free magnetic layer 12 with respect to the pinned magnetic layer 14. The stored data bit can be read out by measuring the resistance of the cell which changes with the magnetization direction of the free layer relative to the pinned magnetic layer. In order for the spin-transfer torque MTJ memory unit 10 to have the characteristics of a non-volatile random access memory, the free layer exhibits thermal stability against random fluctuations so that the orientation of the free layer is changed only when it is controlled to make such a change. This thermal stability can be achieved via the magnetic anisotropy using different methods, e.g., varying the bit size, shape, and crystalline anisotropy. Generally, the anisotropy is associated with a soft and hard axis to form in thin magnetic layers. The hard and soft axes are defined by the magnitude of the energy, usually in the form of a magnetic field, needed to fully rotate (saturate) the direction of the magnetization in that direction, with the hard axis requiring a higher saturation magnetic field.

Figure 3:
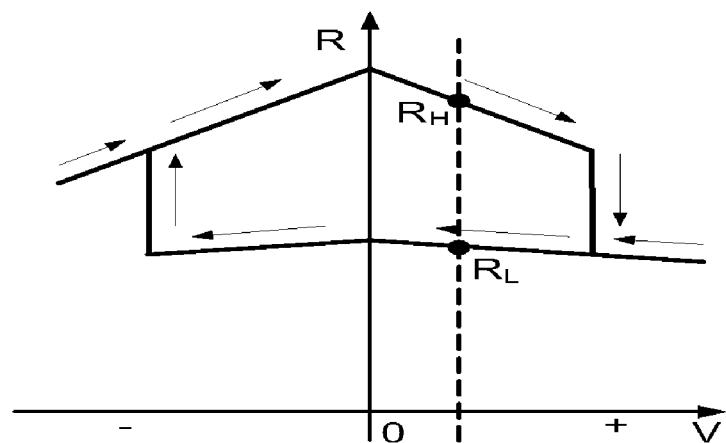
FIG. 3 is a graph of a static R-V (resistance-voltage) curve of a spin-transfer torque MTJ memory unit.

FIG. 3 is a graph of a static R-V sweep curve of a spin-transfer torque MTJ memory unit. When applying a positive voltage on the second electrode 16 in FIG. 1 or 2, the MTJ 10 enters the positive applied voltage region in FIG. 3 and switches from the high resistance state (FIG. 2) to the low resistance state (FIG. 1). When applying a positive voltage on the first electrode 15 in FIG. 1 or 2, the MTJ 10 enters the negative applied voltage region in FIG. 3. The resistance of the MTJ switches from the low resistance state (FIG. 1) to the high resistance state (FIG. 2).

Let $R_H$ and $R_L$ denote the high and low MTJ resistance, respectively. We define the Tunneling Magneto Resistance Ratio (TMR) as TMR=$(R_H-R_L)/R_L$. Here $R_H$, $R_L$ and TMR are determined by also the sensing current or voltage, as shown in FIG. 3. Generally, a large TMR makes it easier to distinguish the two resistance states of the MTJ.

Figure 4:
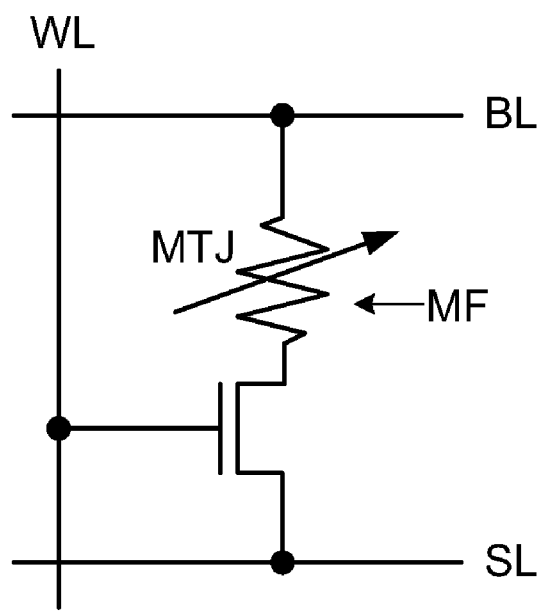
FIG. 4 is a schematic circuit diagram of a spin-transfer torque MTJ memory unit.

FIG. 4 is a schematic diagram of a spin-transfer torque MTJ memory unit MTJ. The spin-transfer torque MTJ memory unit MTJ is electrically connected in series to a transistor such as, for example, a NMOS transistor. The opposing side of the spin-transfer torque MTJ memory unit MTJ is electrically connected to a bit line BL. The transistor is electrically coupled to a source line SL and a word line WL. The MTJ is usually modeled as a variable resistor in circuit schematic, as shown in FIG. 4.

Knowing the direction of the read or write current through the MTJ, an offset external magnetic field can assist (during writing) or hinder (during reading) free layer switching. For example, during the read operation, if the read current direction is from free layer to the pinned layer (from 12 to 14 in FIG. 1), it will stabilize the low resistance state (free layer parallel to pinned layer) and de-stabilize the high resistance state (free layer anti-parallel to pinned layer), because the current can cause the free layer magnetization direction switching from anti-parallel (high resistance state) to parallel (low resistance state). Application of the offset external magnetic field, whose direction (horizontal component) is anti-parallel to pinned layer, such that the energy barrier is increased for the free layer to switch from high resistance state to low resistance state (of course, the energy barrier is decreased for free layer to switch from low resistance state to high resistance state), and a high read current can be used, increasing the reading margin.

During reading, the horizontal component of the external field generates magnetic torque whose direction is opposite to the spin torque, so that a large reading current can be used without flipping the free layer magnetization orientation. At the same time, the perpendicular component generates a magnetic torque to rotate the free layer magnetization orientation, and the reading margin is further increased. In other words, the offset external magnetic field will stabilize the high resistance state and de-stabilize low resistance state, which is opposite to the current effect, the offset external magnetic field effect will either fully or partially cancel the current effect, thus, a large read current can be used and the reading margin increases.

The reversed case happens during the write operation. For example, during write, to write "0" (low resistance state), application of current from free layer to the pinned lay (from 12 to 14 in FIG. 1), at the same time, the offset external magnetic field direction (horizontal component) is parallel to pinned layer (opposite to the direction during reading), which decreases the energy barrier value for the free layer to switch from high resistance state to low resistance state, so a small write current is needed. During writing, the horizontal component of the external magnetic field generates a magnetic torque whose direction is the same as that of spin torque, and the perpendicular component generates magnetic torque to increase initial angle, such that the switching current is reduced and the write speed is increased. In other words, the offset external magnetic field effect enhances the current effect during the write operation.

In both read and write cases, the initial free layer state doe not matter. For example, during the read operation in above example, if the free layer is at the low resistance state, the read current will stabilize this state but the offset external magnetic field will de-stabilize this state, both effects will cancel each other; the reverse case happens if the free layer is at the high resistance state. During the write operation in above example, independent of the initial free layer state, both the current and the offset magnetic field (horizontal component) stabilizes the low resistance state, so the free layer will stay at a low resistance state if the initial data state is at the low resistance state and will switch to the low resistance state if the initial data state is at the high resistance state. Thus, read and write operations of the MTJ can be designed utilizing the magnetic field and specified angle generated by the magnetic field generator MF to increase the reading margin and decrease the write current.

Figure 5A:
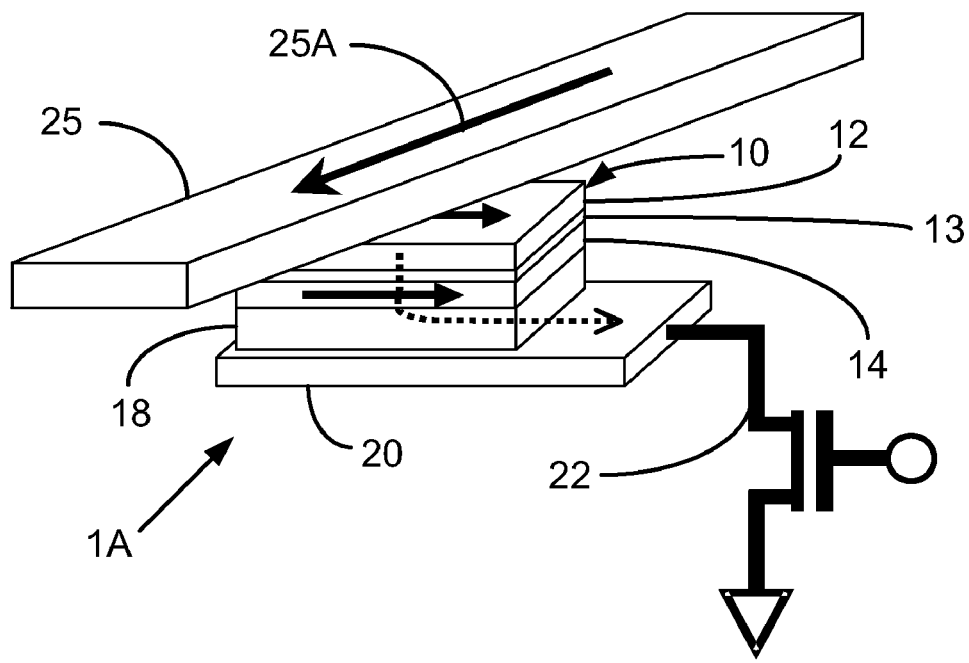
FIG. 5A is a schematic perspective view of one embodiment of a magnetic memory unit having a magnetic tunnel junction cell with an adjacent magnetic field generator.

FIG. 5A is a schematic perspective view of one embodiment of a magnetic memory unit 1A having a magnetic tunnel junction cell with an adjacent magnetic field generator 25. Memory unit 1A includes magnetic tunnel junction cell 10. Magnetic tunnel junction cell 10 has a magnetic (e.g., ferromagnetic) free layer 12, a nonmagnetic tunnel barrier 13, a magnetic (e.g., ferromagnetic) pinned (i.e., reference) layer 14, and an optional antiferromagnetic pinning layer 18, arranged with tunnel barrier 13 positioned between free layer 12 and pinned layer 18, and pinning layer 18 proximate pinned layer 14 opposite tunnel barrier 13. In the illustrated orientation, free layer 12 is the top layer of the stack of layers. Tunnel barrier 14 spatially separates free layer 12 from pinned layer 14. Proximate pinning layer 18 is an electrode 20 (e.g., bit line) that electrically connects magnetic tunnel junction cell 10 to control transistor 22.

The ferromagnetic layers for the structure, e.g., free layer 12 and pinned layer 14, can be, but not be limited to, transition metals such as Ni, Co, Fe and their alloys such as NiFe and CoFe, as described above. Ternary alloys, such as CoFeB, may be particularly useful because of their lower moment and high polarization ratio, which are desirable for the spin-current switch. Either or both of free layer 12 and pinned layer 14 may be either a single layer or an unbalanced synthetic antiferromagnetic (SAF) coupled structure, i.e., two ferromagnetic sublayers separated by a metallic spacer, such as Ru or Cu, with the magnetization orientations of the sublayers in opposite directions to provide a net magnetization.

Tunnel barrier layer 13 may be a nonmagnetic metallic material or a nonmagnetic metal oxide material; examples of suitable conductive metallic materials include Cu, Ag, and Au, and examples of insulating oxide and semiconductor barriers include AlO, $Al_2O_3$, TiO, and MgO. Tunneling barrier layer 13 could optionally be patterned with free layer 12 or with pinned layer 14, depending on process feasibility and device reliability.

Each of free layer 12 and pinned layer 14 has a magnetic orientation or magnetization orientation associated therewith. Pinned layer 14 is pinned by antiferromagnetic pinning layer 18, or in other embodiments, may be a fixed layer without pinning but with a high coercivity to stabilize itself.

In FIG. 5A, the magnetization orientation of free layer 12, due to spin polarization, is illustrated parallel to the magnetization orientation of pinned layer 14, due to a current being passed through magnetic tunnel junction cell 10 in the direction from free layer 12 to pinned layer 14 (illustrated by the dashed line).

Positioned at an angle other than orthogonal or parallel to the possible orientation directions of the magnetization of free layer 12 and pinned layer 14, a magnetic field generator 25 is provided proximate magnetic tunnel junction cell 10. For memory unit 1A of FIG. 5A, magnetic field generator 25 is proximate free layer 12. Magnetic field generator 25 provides an offset magnetic field with current flow 25A in a direction that generates an ampere field that has some angle (other than orthogonal or parallel) to that of the direction of the magnetization orientation of the free layer. The magnetic field rotates the magnetization orientation of the free magnetic layer without switching a resistance state of the magnetic tunnel junction data cell. A horizontal component of the offset magnetic field stabilizes the magnetization orientation of the free layer so that a large current can be utilized to read the magnetic tunnel junction cell 10 without switching a resistance state of the magnetic tunnel junction data cell. A perpendicular component of the offset magnetic field generates a magnetic torque to rotate the free layer and further increase the reading margin of the magnetic tunnel junction cell 10.

During a write operation, when the spin polarized free layer magnetization is in same direction as a horizontal component of the ampere or offset magnetic field, the current ampere offset magnetic field reduces the switching barrier of free layer 12 and magnetic tunnel junction cell 10, and rotates the free layer magnetization. Thus the required writing spin torque switching current is reduced, as graphically illustrated below. If the desired final state of magnetic tunnel junction cell 10 is an antiparallel magnetization configuration between free layer 12 and pinned layer 14, the current for spin torque is applied in the opposite direction, from pinned layer 14 to free layer 12. Simultaneously, the direction of offset magnetic field generated by the magnetic field generator 25 is reversed as well, by reversing the direction of the current through the electrically conductive wire 25.

Figure 5B:
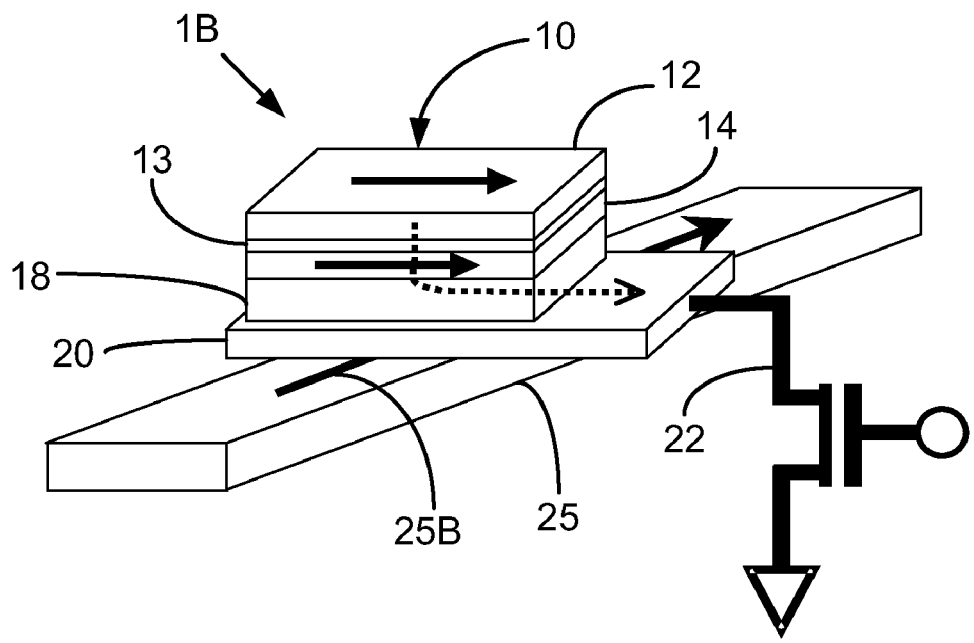
FIG. 5B is a schematic perspective view of another embodiment of a magnetic memory magnetic memory unit having a magnetic tunnel junction cell with an adjacent magnetic field generator.

FIG. 5B illustrates an alternate embodiment of a memory unit having magnetic field generator 25 (e.g., ampere magnetic field source) positioned orthogonal to the possible orientation directions of the magnetization of free layer 12 and pinned layer 14. In FIG. 5B memory unit 1B is similar to memory unit 1A in that it includes magnetic tunnel junction cell 10 having ferromagnetic free layer 12, nonmagnetic tunnel barrier 13, ferromagnetic pinned layer 14, antiferromagnetic pinning layer 18, and electrode 20. For memory unit 1B, however, magnetic field generator 25 is proximate electrode 20 and pinned layer 14. The operation of the memory unit 1B is similar to the operation of the memory unit 1A, described above.

Positioned at an angle other than orthogonal or parallel to the possible orientation directions of the magnetization of free layer 12 and pinned layer 14, a magnetic field generator 25 is provided proximate magnetic tunnel junction cell 10. For memory unit 1B of FIG. 5B, magnetic field generator 25 is proximate free layer 12. Magnetic field generator 25 provides an offset magnetic field with current flow 25B in a direction that generates an ampere field that has some angle (other than orthogonal or parallel) to that of the direction of the magnetization orientation of the free layer. The magnetic field rotates the magnetization orientation of the free magnetic layer without switching a resistance state of the magnetic tunnel junction data cell. A horizontal component of the offset magnetic field stabilizes the magnetization orientation of the free layer so that a large current can be utilized to read the magnetic tunnel junction cell 10 without switching a resistance state of the magnetic tunnel junction data cell. A perpendicular component of the offset magnetic field generates a magnetic torque to rotate the free layer and further increase the reading margin of the magnetic tunnel junction cell 10.

Figure 6:
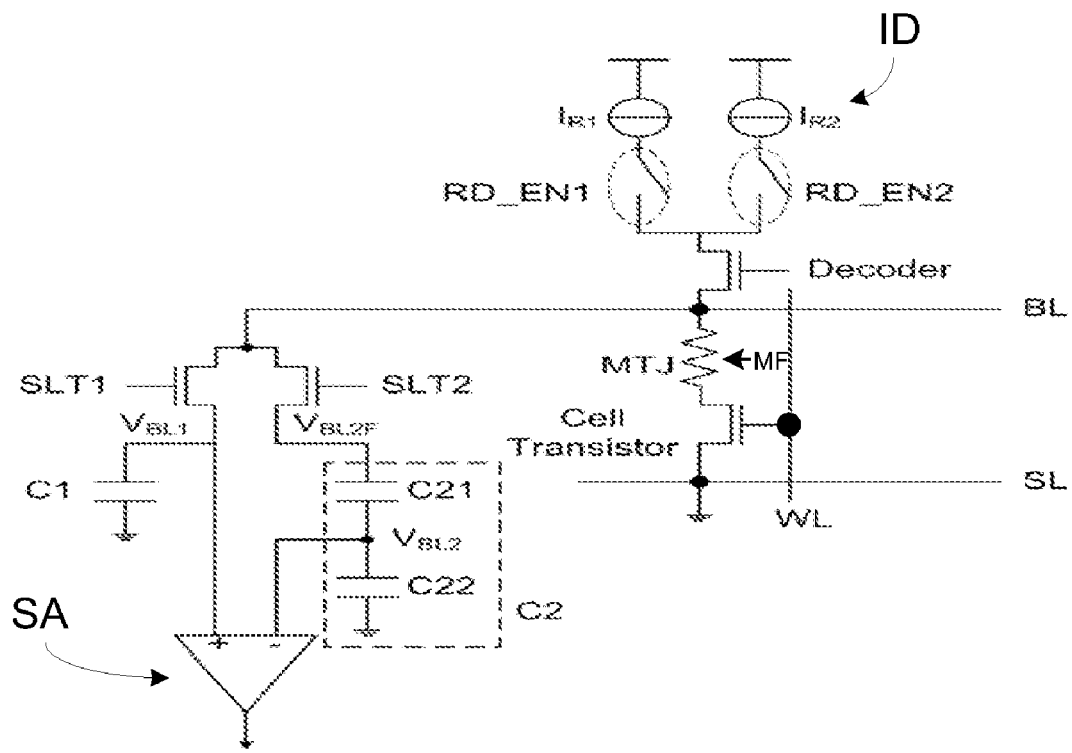
FIG. 6 is a schematic circuit diagram of an illustrative spin-transfer torque MTJ memory apparatus.

FIG. 6 is a schematic circuit diagram of an illustrative spin-transfer torque MTJ memory apparatus. The apparatus includes a magnetic tunnel junction data cell MTJ including a ferromagnetic free layer and a ferromagnetic reference layer separated by an oxide barrier layer, as described above. The magnetic tunnel junction data cell MTJ is electrically between a bit line BL and a source line SL. The magnetic tunnel junction data cell MTJ is configured to switch between a high resistance state and a low resistance state by passing a polarized write current through the magnetic tunnel junction data cell MTJ.

A magnetic field generator MF is adjacent to the magnetic tunnel junction data cell MTJ. The magnetic field generator MF provides a magnetic field through the free magnetic layer of the MTJ the forming a magnetic field modified magnetic tunnel junction data cell. The magnetic field is parallel with the magnetization orientation of the free magnetic layer. The magnetic field applied in a first direction stabilizes the low resistance data state of the MTJ free layer, while de-stabilizing the high resistance data state of the MTJ free layer. When the magnetic field is applied in a second direction opposing the first direction this magnetic field stabilizes the high resistance data state of the MTJ free layer, while de-stabilizing the low resistance data state of the MTJ free layer. Thus, read and write operations of the MTJ can be designed utilizing the magnetic field generated by the magnetic field generator MF to increase the reading margin and decreasing the write current.

A cell transistor allows read and write current to flow through the magnetic tunnel junction data cell MTJ. A gate contact of the cell transistor is electrically coupled to a word line WL to allow selection of the particular cell transistor and associated magnetic tunnel junction data cell MTJ. An adjustable current driver ID is electrically coupled to the bit line, the adjustable current driver configured to provide a first read current $I_{R1}$ and a second read current $I_{R2}$ through the magnetic tunnel junction data cell MTJ. A first voltage storage device C1 is electrically coupled to the bit line BL and configured to store a first bit line voltage $V_{BL1}$ formed by the first read current $I_{R1}$. A second voltage storage device C2 is electrically coupled to the bit line BL and configured to store a second bit line voltage $V_{BL2}$ formed by the second read current $I_{R2}$. In many embodiments, the second voltage storage device C2 is a second voltage storage device C21 electrically coupled to the bit line BL and a third voltage storage device C22 electrically coupled to the bit line BL, and the second voltage storage device C21 and the third voltage storage device C22 are electrically connected in series, as shown in FIG. 6. In many embodiments, the first voltage storage device C1, the second voltage storage device C21, and the third voltage storage device C22 are capacitors. Useful capacitors include, for example, NMOS/PMOS capacitors, MIM capacitors, and vertical natural capacitors, among others.

A differential sense amplifier SA is electrically coupled to the first voltage storage device C1 and is electrically coupled to an intermediate node electrically between the second voltage storage device C21 and the third voltage storage device C22. The differential sense amplifier SA is configured to compare the first bit line voltage $V_{BL1}$ with the second bit line voltage $V_{BL2}$. A first switch transistor STL1 is electrically connected to the bit line BL and the first voltage storage device C1. A second switch transistor STL2 is electrically connected to the bit line BL and the second voltage storage device C21 and the third voltage storage device C22. In many embodiments, the voltage storage devices are capacitors. In many embodiments, the second voltage storage device C21 and the third voltage storage device C22 are capacitors that each has substantially the same capacitance value as each other.

A first read current $I_{R1}$ is applied and incurs the corresponding BL voltage $V_{BL1}$, which is stored in C1. Depending on the resistance state of the MTJ, $V_{BL1}$ can be either $V_{BL,L1}$ or $V_{BL,H1}$, which are the BL voltage for low resistance state of MTJ or high resistance state of MTJ, at $I_{R1}$. A second read current $I_{R2}$ which is larger than $I_{R1}$ is applied and incurs BL voltage $V_{BL2}$, which is stored in C21 and C22.

By comparing $V_{BL1}$ and $V_{BL2}$ with the differential sense amplifier, the data resistance state of the MTJ can be readout. For example, if the first bit line read voltage $V_{BL1}$ is not substantially the same as or is larger than or significantly larger than the second bit line read voltage $V_{BL2}$ then the first resistance state is determined to be a high resistance state. Accordingly, if the first bit line read voltage $V_{BL1}$ is substantially the same as or less than the second bit line read voltage $V_{BL2}$ then the first resistance state is determined to be a low resistance state.

In many embodiments, if the stored first bit line read voltage $V_{BL1}$ is 20% greater than, or 25% greater than, or 50% greater than, or 100% greater than, the stored second bit line read voltage $V_{BL2}$ then the first resistance state is determined to be a high resistance state. Otherwise the resistance state is determined to be a low resistance state.

Figure 7:
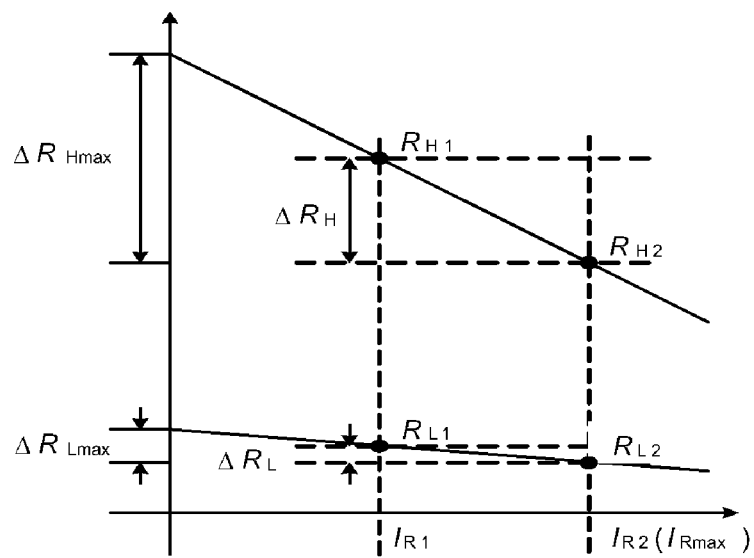
FIG. 7 is a graph of I-R (current-resistance) curves of the MTJ high resistance state and low resistance state without a varying external magnetic field applied during the first and second read operations.

FIG. 7 is a graph of I-R curves of the MTJ high resistance state and low resistance state without providing an external magnetic field to the MTJ for either read current $I_{R1}$ and $I_{R2}$. The reference points $R_{L1}$ and $R_{L2}$ refer to the low resistance values (data state "0") of the MTJ at the first read current $I_{R1}$ and the second read current $I_{R2}$, respectively. The reference points $R_{H1}$ and $R_{H2}$ refer to the high resistance values (data state "1") of the MTJ at the first read current $I_{R1}$ and the second read current $I_{R2}$, respectively. The value $\Delta R_{LMAX}$ refers to the change in the MTJ low resistance value from zero to the maximum allowable read current $I_{RMAX}$. The value $\Delta R_{LMAX}$ refers to the change in the MTJ high resistance value from zero to the maximum allowable read current $I_{RMAX}$.

As illustrated in FIG. 7, the resistance of the magnetic tunnel junction data cell MTJ at the low resistance state is fairly insensitive to the change of read current/voltage. On the other hand, the resistance of the magnetic tunnel junction data cell MTJ at the high resistance state drops quickly when the read current/voltage increases. The change in the high state resistance value from the first read current $I_{R1}$ to the second read current $I_{R2}$ is shown as $\Delta R_H$. The change in the low state resistance value from the first read current $I_{R1}$ to the second read current $I_{R2}$ is shown as $\Delta R_L$. As illustrated, $\Delta R_L$ is significantly less than $\Delta R_H$. Knowing that $\Delta R_L$ is significantly less than $\Delta R_H$ provides a means for comparing the voltage or resistance across the magnetic tunnel junction data cell MTJ to determine if it is in the high or low resistance state. The first read current $I_{R1}$ is less than the second read current. In many embodiments, the first read current $I_{R1}$ is 10% to 50% of the second read current $I_{R2}$. In many embodiments, the first read current $I_{R1}$ is 10% to 30% of the second read current $I_{R2}$.

By providing a stabilizing external magnetic field through the free layer of the spin-transfer torque memory unit, the reading margin can be improved relative to the reading margin illustrated in FIG. 7. Providing a de-stabilizing external magnetic field through the free layer of the spin-transfer torque memory unit decreases the write current required to switch the resistance data state of the spin-transfer torque memory unit.

Figure 8:
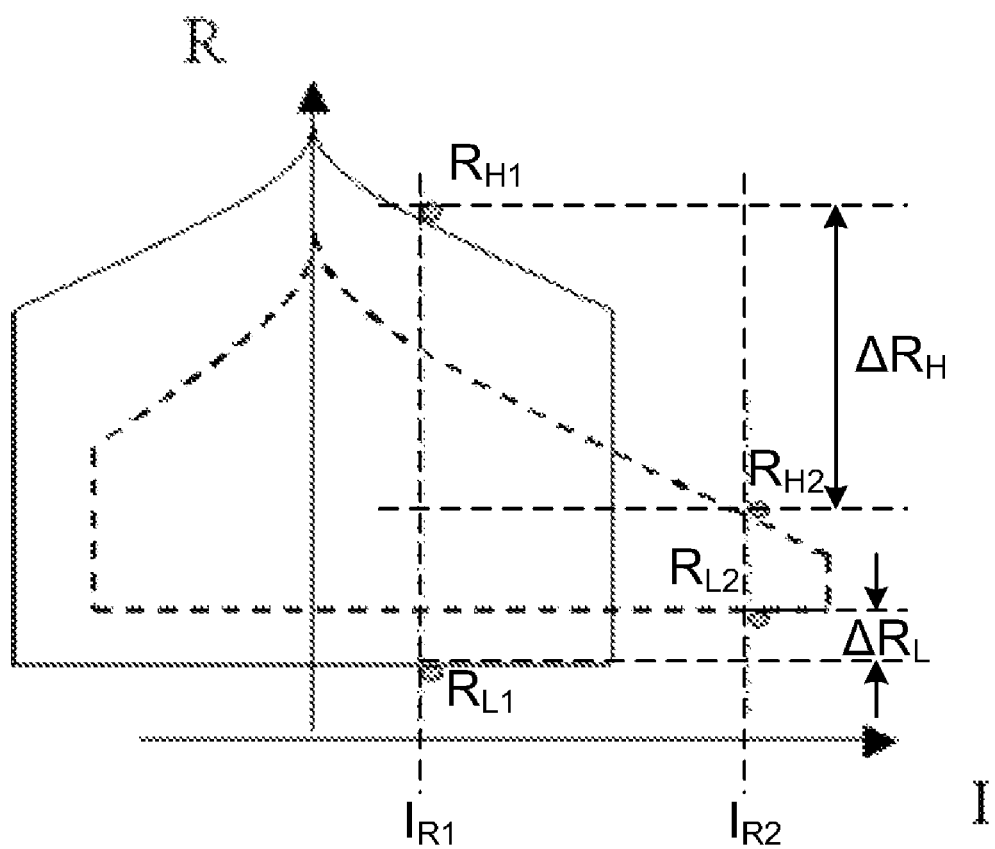
FIG. 8 is a graph of an I-R (current-resistance) curve of the MTJ high resistance state and low state with and without an applied external off-set magnetic field.

FIG. 8A is a graph of an I-R (current-resistance) curve of the MTJ high resistance state and low resistance state. FIG. 8B is a graph of an I-R (current-resistance) curve of the MTJ high resistance state and low resistance state with an applied external stabilizing magnetic field. The change in the high state resistance value from the first read current $I_{R1}$ to the second read current $I_{R2}$ (with the applied stabilizing external magnetic field, as described above) is shown as $\Delta R_H$. The change in the low state resistance value from the first read current $I_{R1}$ to the second read current $I_{R2}$ (with the applied stabilizing external magnetic field, as described above) is shown as $\Delta R_L$. As similarly illustrated in FIG. 7, $\Delta R_L$ is significantly less than $\Delta R_H$. Knowing that $\Delta R_L$ is significantly less than $\Delta R_H$ provides a means for comparing the voltage or resistance across the magnetic tunnel junction data cell MTJ to determine if it is in the high or low resistance state. The first read current $I_{R1}$ is less than the second read current. In many embodiments, the first read current $I_{R1}$ is 10% to 50% of the second read current $I_{R2}$. In many embodiments, the first read current $I_{R1}$ is 10% to 30% of the second read current $I_{R2}$.

The external magnetic field stabilizes both the high resistance state and low resistance state energy barriers for the second read operation. This allows the second reading current to be a greater value than is possible in the graph of FIG. 8A (having a lower stabilizing magnetic field or no stabilizing magnetic field) without switching the resistance state of the MTJ. Therefore, the reading margin for the high resistance state is increased as compared to the reading margin illustrated in FIG. 7. For example the second reading current $I_{R2}$ FIG. 8B is greater than the switching current of FIG. 8A.

Figure 9A:
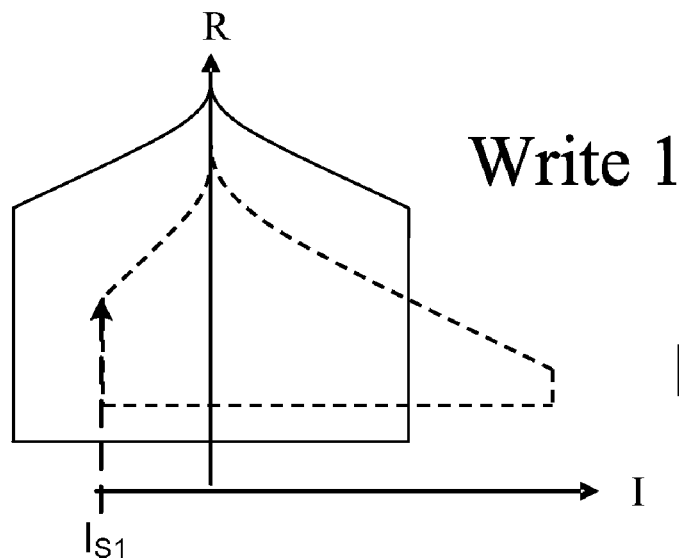
FIG. 9A is a graph of an I-R (current-resistance) curve of the MTJ high resistance state and low resistance state illustrating an applied de-stabilizing magnetic field assisting in the writing of the high resistance state.
Figure 9B:
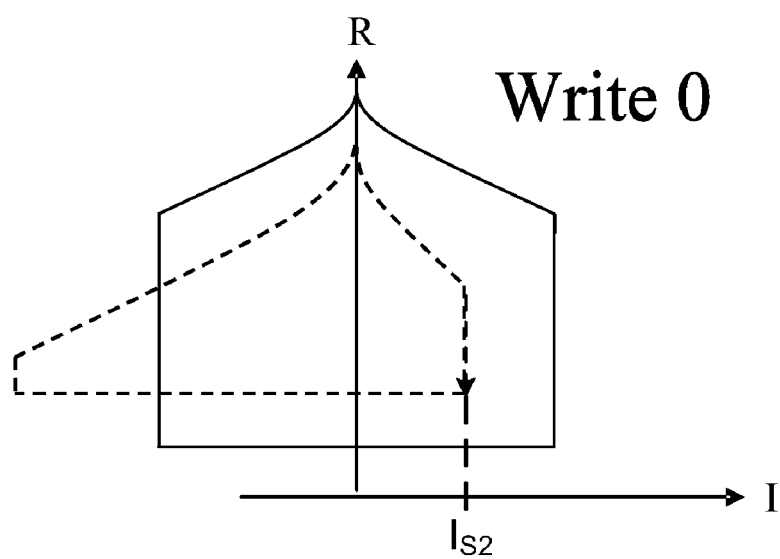
FIG. 9B is a graph of an I-R (current-resistance) curve of the MTJ high resistance state and low resistance state illustrating an applied de-stabilizing magnetic field assisting in the writing of the low resistance state.

FIG. 9A is a graph of an I-R (current-resistance) curve of the MTJ high resistance state and low resistance state illustrating an applied de-stabilizing magnetic field assisting in the writing of the high resistance state. FIG. 9B is a graph of an I-R (current-resistance) curve of the MTJ high resistance state and low resistance state illustrating an applied de-stabilizing magnetic field assisting in the writing of the low resistance state. As compared to the FIG. 8A graph of the I-R (current-resistance) curve of the MTJ high resistance state and low resistance state, the applied de-stabilizing magnetic field reduces the energy barrier, first switching current $I_{S1}$, and time required to switch the MTJ to a high resistance state (FIG. 9A) or when applied in an opposing direction, the applied de-stabilizing magnetic field reduces the energy barrier, second switching current $I_{S2}$, and time required to switch the MTJ to a low resistance state (FIG. 9B).

Figure 10:
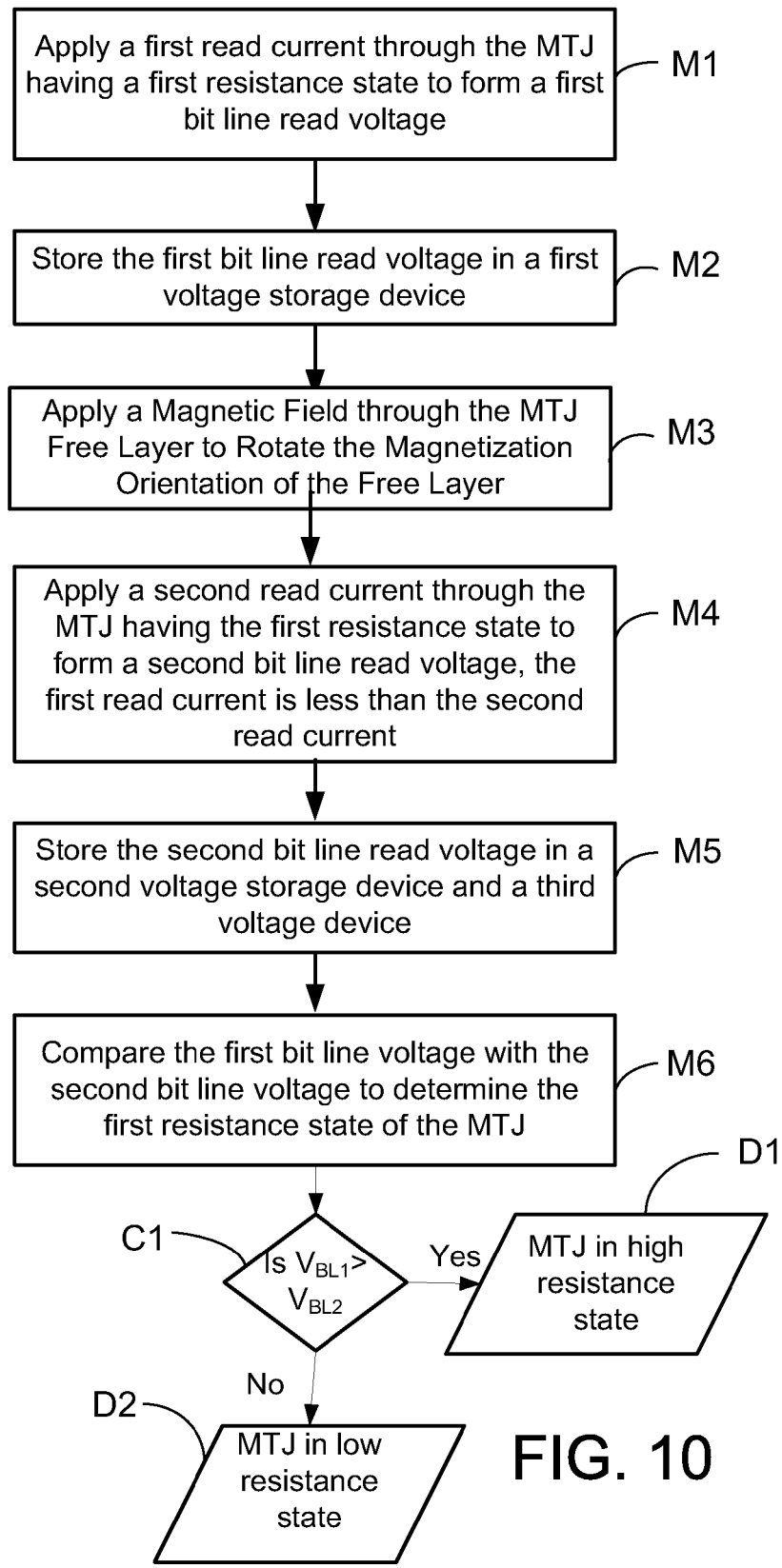
FIG. 10 is a flow diagram of an illustrative self-reference reading method.

FIG. 10 is a flow diagram of an illustrative self-reference reading method. The method includes applying a first read current through a magnetic tunnel junction data cell and forming a first bit line read voltage, the magnetic tunnel junction data cell having a first resistance state at block M1 and storing the first bit line read voltage in a first voltage storage device at block M2. An offset magnetic field is applied to or through the free layer of the MTJ to rotate the magnetization orientation of the free layer at block M3. Then, a second read current is applied thorough the first resistance state magnetic tunnel junction data cell to form a second bit line read voltage, where the first read current is less than the second read current at block M4 and storing the second bit line read voltage in a second voltage storage device and third voltage storage device at block M5. Then comparing the first bit line read voltage with the second bit line read voltage to determine whether the first resistance state of the magnetic tunnel junction data cell was a high resistance state or low resistance state at block M6.

The comparing block C1 compares the first bit line read voltage ($V_{BL1}$) with the second bit line read voltage ($V_{BL2}$). If the first bit line read voltage ($V_{BL1}$) is greater than the second bit line read voltage ($V_{BL2}$) then the first resistance state of the magnetic tunnel junction data cell is a high resistance state at block D1. If the first bit line read voltage ($V_{BL1}$) is not greater than the second bit line read voltage ($V_{BL2}$) then the first resistance state of the magnetic tunnel junction data cell is a low resistance state block D2.

The comparing step includes comparing the first bit line read voltage with the second bit line read voltage and if the first bit line read voltage is greater than or is significantly greater than the second bit line read voltage then the first resistance state is determined to be a high resistance state. Accordingly, if the first bit line read voltage is substantially the same as or less than the second bit line read voltage then the first resistance state is determined to be a low resistance state.

Figure 11:
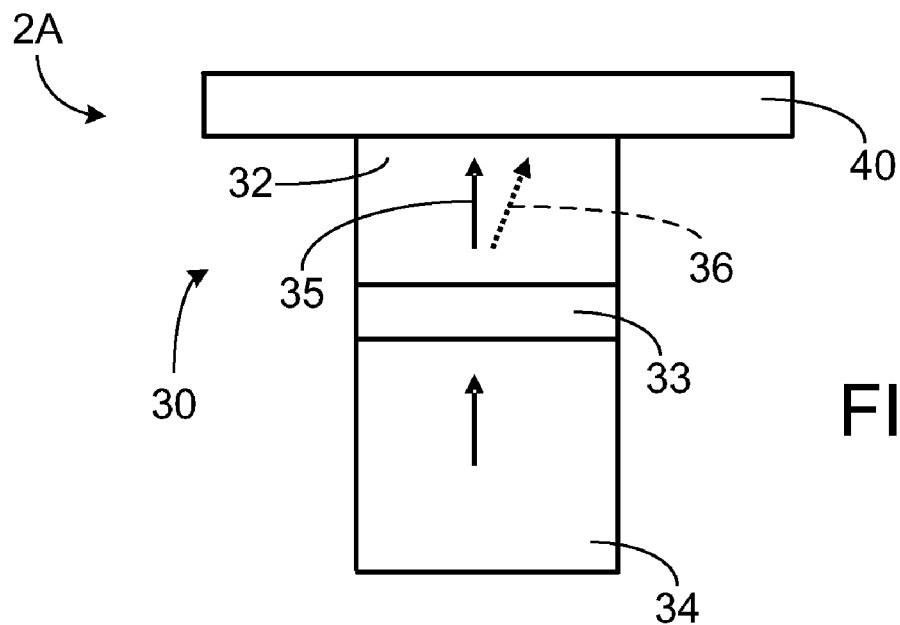
FIG. 11 is a schematic cross-section view of an embodiment of a magnetic memory unit having a magnetic tunnel junction cell with perpendicular magnetization orientation and an adjacent magnetic field generator.

FIG. 11 is a schematic cross-section view of an embodiment of a magnetic memory unit 2A having a magnetic tunnel junction cell 30 with perpendicular magnetization orientation 35 and an adjacent magnetic field generator 40. Memory unit 2A includes magnetic tunnel junction cell 30. Magnetic tunnel junction cell 30 has a magnetic (e.g., ferromagnetic) free layer 32, a nonmagnetic tunnel barrier 33, a magnetic (e.g., ferromagnetic) pinned (i.e., reference) layer 34, as described above. Proximate the free layer 32 is an electrode 20 (e.g., bit line) that electrically connects magnetic tunnel junction cell 30 to control transistor (not shown). The magnetic layers 32 and 34 of the magnetic tunnel junction cell 30 posses a perpendicular magnetization orientation 35, that is, the magnetization orientation 35 is directed perpendicular to the in-plane direction of the particular magnetic layers 32 and 34, as illustrated. Passing a read current through the bit line 40 and magnetic tunnel junction cell 30 generates a magnetic field having an in-plane direction with the free layer 32 and that disturbs or rotates the perpendicular magnetization orientation as illustrated with the dashed magnetization orientation 36.

Figure 12:
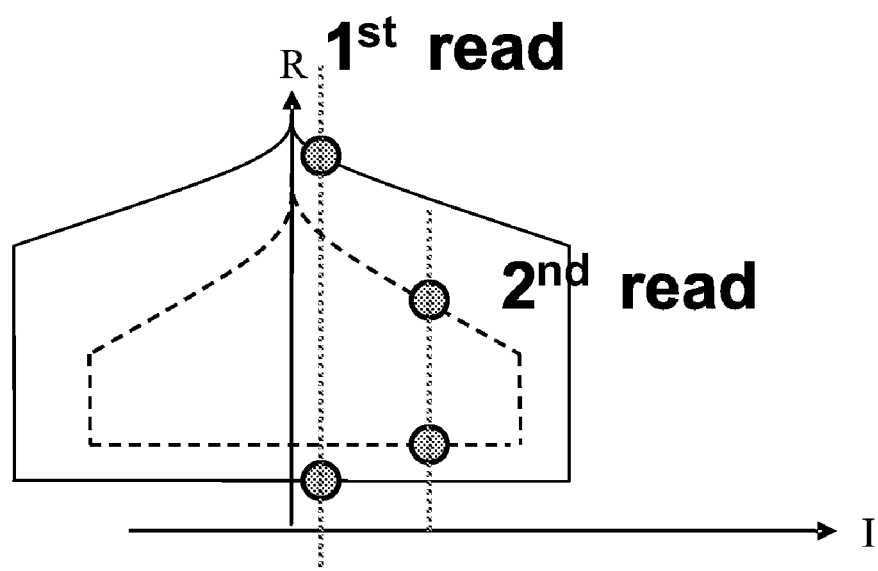
FIG. 12 is a graph of I-R (current-resistance) curves of the MTJ of FIG. 11 high resistance state and low resistance state with and without an external magnetic field applied during the first and second read operations.

FIG. 12 is a graph of I-R (current-resistance) curves of the MTJ of FIG. 11 high resistance state and low resistance state with and without an external magnetic field applied during the first and second read operations. Utilizing the configuration of FIG. 11, a first read current generates a magnetic field that is small and only slightly disturbs the perpendicular magnetization orientation of the free layer. A second larger read current generates a larger magnetic field that disturbs the perpendicular magnetization orientation of the free layer and provides an increased reading margin as illustrated in FIG. 12.

Figure 13:
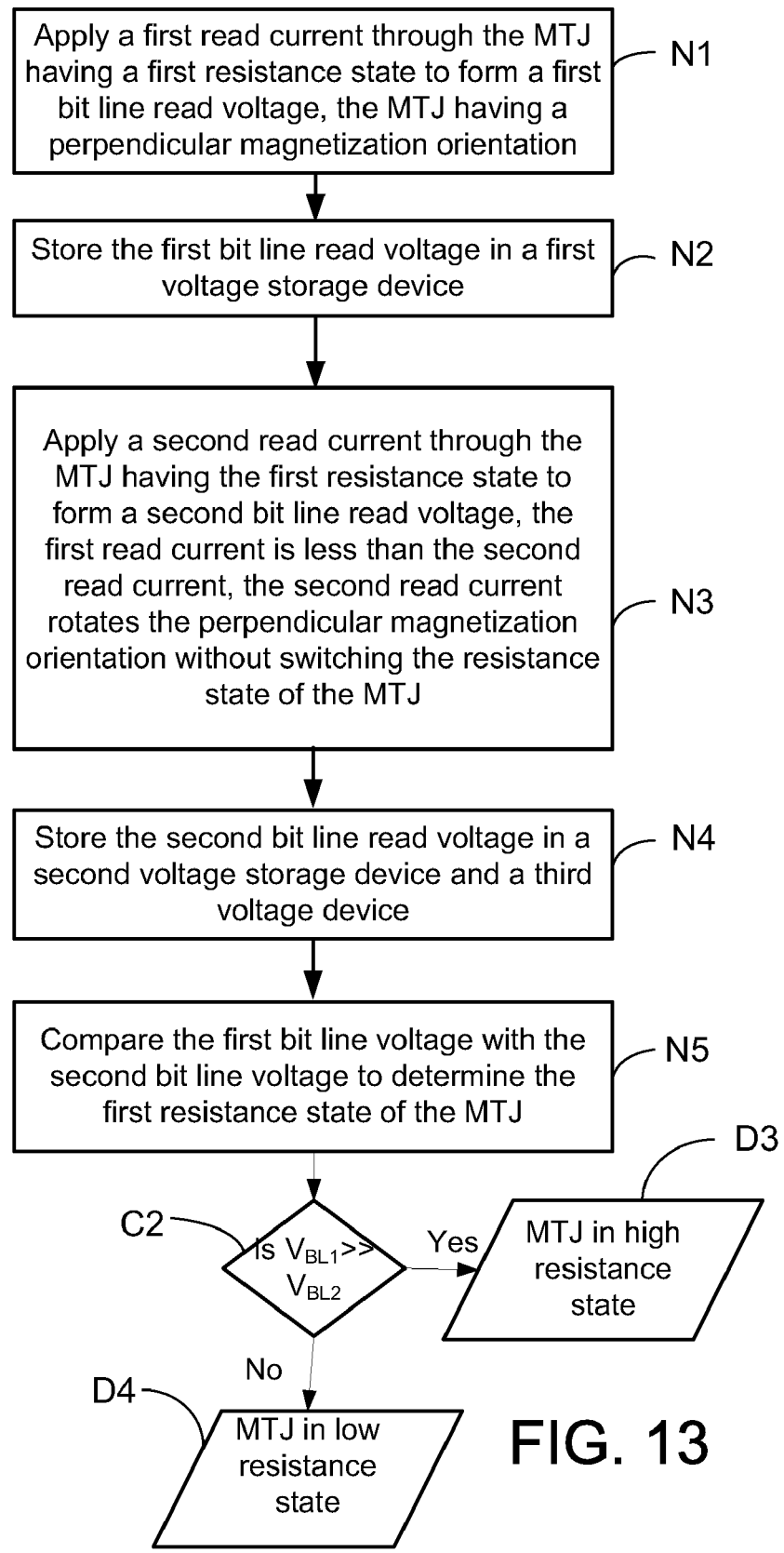
FIG. 13 is a flow diagram of an illustrative self-reference reading method for perpendicular STRAM The figures are not necessarily to scale. Like numbers used in the figures refer to like components. However, it will be understood that the use of a number to refer to a component in a given figure is not intended to limit the component in another figure labeled with the same number.

FIG. 13 is a flow diagram of an illustrative self-reference reading method for perpendicular STRAM. The method includes applying a first read current through a magnetic tunnel junction data cell and forming a first bit line read voltage, the magnetic tunnel junction data cell having a first resistance state, the MTJ having a perpendicular magnetization orientation, at block N1 and storing the first bit line read voltage in a first voltage storage device at block N2. Then, a second read current is applied thorough the first resistance state magnetic tunnel junction data cell to form a second bit line read voltage, where the first read current is less than the second read current, and the second read current rotates the perpendicular magnetization orientation without switching the resistance state of the MTJ, at block N3 and storing the second bit line read voltage in a second voltage storage device and third voltage storage device at block N4. Then the method includes comparing the first bit line read voltage with the second bit line read voltage to determine whether the first resistance state of the magnetic tunnel junction data cell was a high resistance state or low resistance state at block N5.

The comparing block C2 compares the first bit line read voltage ($V_{BL1}$) with the second bit line read voltage ($V_{BL2}$). If the first bit line read voltage ($V_{BL1}$) is greater than the second bit line read voltage ($V_{BL2}$) then the first resistance state of the magnetic tunnel junction data cell is a high resistance state at block D3. If the first bit line read voltage ($V_{BL1}$) is not greater than the second bit line read voltage ($V_{BL2}$) then the first resistance state of the magnetic tunnel junction data cell is a low resistance state block D4.

The comparing step includes comparing the first bit line read voltage with the second bit line read voltage and if the first bit line read voltage is greater than or is significantly greater than the second bit line read voltage then the first resistance state is determined to be a high resistance state. Accordingly, if the first bit line read voltage is substantially the same as or less than the second bit line read voltage then the first resistance state is determined to be a low resistance state.

Thus, embodiments of the SPIN-TRANSFER TORQUE MEMORY SELF-REFERENCE READ AND WRITE ASSIST METHODS are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A method of self-reference reading a spin-transfer torque memory unit, comprising:
    applying a first read current through a magnetic tunnel junction data cell and forming a first bit line read voltage, the magnetic tunnel junction data cell having a first resistance state, the magnetic tunnel junction comprising a free magnetic layer having a magnetization orientation;
    applying a first magnetic field through the free magnetic layer and forming a magnetic field modified magnetic tunnel junction data cell;
    applying a second read current thorough the magnetic field modified magnetic tunnel junction data cell having the first resistance state and forming a second bit line read voltage, the first read current being less than the second read current; and
    comparing the first bit line read voltage with the second bit line read voltage to determine whether the first resistance state of the magnetic tunnel junction data cell was a high resistance state or low resistance state.

2. A method according to claim 1, wherein the first read voltage is stored in a first voltage storage device and the second bit line read voltage is stored in a second voltage storage device.

3. A method according to claim 2 wherein the second bit line read voltage is stored in a second voltage storage device and a third voltage storage device, the second voltage storage device and the third voltage storage device are electrically connected in series.

4. A method according to claim 1, wherein the comparing step comprises comparing the first bit line read voltage with the second bit line read voltage and if the first bit line read voltage is substantially the same as or less than the second bit line read voltage, then the first resistance state is determined to be a low resistance state.

5. A method according to claim 1, wherein the comparing step comprises comparing the first bit line read voltage with the second bit line read voltage and if the first bit line read voltage is greater than or not substantially the same as the second bit line read voltage, then the first resistance state is determined to be a high resistance state.

6. A method according to claim 1, wherein the comparing step comprises comparing the first bit line read voltage with the second bit line read voltage and if the first bit line read voltage is 25% greater than the second bit line read voltage then the first resistance state is determined to be a high resistance state.

7. A method according to claim 1, wherein the applying a magnetic field through the free magnetic layer step comprises generating a magnetic field by passing a current through a wire, the wire being adjacent to the magnetic tunnel junction data cell.

8. A method according to claim 1, wherein the first read current is in a range from 10% to 50% of the second read current.

9. A method according to claim 1, wherein the applying a first read current step occurs without applying a magnetic field through the free magnetic layer.

10. A method according to claim 1, wherein the applying a first read current step occurs while applying a second magnetic field through the free magnetic layer.

11. A method according to claim 1, wherein the applying a first read current step occurs while applying a second magnetic field through the free magnetic layer, the second magnetic field having a different magnitude than the first magnetic field.

12. A method of writing to a spin-transfer torque memory unit, comprising:
    applying a magnetic field through a free magnetic layer of a magnetic tunnel junction data cell, forming a magnetic field modified magnetic tunnel junction data cell; and
    applying a write current through the magnetic field modified magnetic tunnel junction data cell, the write current being sufficient to switch the magnetic field modified magnetic tunnel junction data cell between a high resistance state and low resistance state.

13. A method according to claim 12, wherein the applying a magnetic field step comprises generating a magnetic field by passing a current through a wire, the wire being adjacent to the magnetic tunnel junction data cell.

14. A method according to claim 12, wherein the applying a magnetic field step reduces a switching current required to switch the magnetic field modified magnetic tunnel junction data cell between a high resistance state and low resistance state as compared to method without the applying a magnetic field step.

15. A method according to claim 12, wherein the applying a magnetic field step reduces a time duration required to switch the magnetic field modified magnetic tunnel junction data cell between a high resistance state and low resistance state as compared to method without the applying a magnetic field step.

16. A method according to claim 12, wherein the write current is a polarized write current.

17. A method according to claim 12, wherein the magnetic field formed in a first direction through the free magnetic layer assists in switching the free magnetic layer magnetization orientation from a low resistance state to a high resistance state and the magnetic field formed in a second direction, opposing the first direction, through the free magnetic layer assists in switching the free magnetic layer magnetization orientation from a high resistance state to a low resistance state.

18. A method of self-reference reading a spin-transfer torque memory unit, comprising:
    applying a first read current through a bit line to a magnetic tunnel junction data cell and forming a first bit line read voltage, the magnetic tunnel junction data cell having a first resistance state, the magnetic tunnel junction comprising a free magnetic layer having a magnetization orientation perpendicular to an in-plane direction of the free magnetic layer;

applying a second read current thorough the bit line to the magnetic tunnel junction data cell having the first resistance state and the second read current generating a magnetic field to rotate the magnetization orientation of the free magnetic layer without switching a resistance state of the magnetic tunnel junction, and forming a second bit line read voltage, the first read current being less than the second read current; and comparing the first bit line read voltage with the second bit line read voltage to determine whether the first resistance state of the magnetic tunnel junction data cell was a high resistance state or low resistance state.

19. A method according to claim 18, wherein the magnetic field is generated in the in-plane direction of the free magnetic layer.

20. A method according to claim 18, wherein the first read current is 10% to 50% of the second read current.

* * * * *